(12) United States Patent
Martiel et al.

(10) Patent No.: US 11,488,051 B2
(45) Date of Patent: Nov. 1, 2022

(54) COMPILING METHOD AND SYSTEM WITH PARTIAL SYNTHETIZATION OF QUANTUM COMPUTER COMPLIANT QUANTUM CIRCUITS

(71) Applicant: BULL SAS, Les Clayes sous Bois (FR)

(72) Inventors: Simon Martiel, Versailles (FR); Timothée Goubault De Brugière, Croissy S/Seine (FR)

(73) Assignee: BULL SAS, Les Clayes sous Bois (FR)

( * ) Notice: Subject to any disclaimer, the term of this patent is extended or adjusted under 35 U.S.C. 154(b) by 0 days.

(21) Appl. No.: 17/355,803

(22) Filed: Jun. 23, 2021

(65) Prior Publication Data
US 2021/0406755 A1    Dec. 30, 2021

(30) Foreign Application Priority Data
Jun. 26, 2020    (EP) .................................... 20305707

(51) Int. Cl.
*G06N 10/00* (2022.01)
*H03K 19/195* (2006.01)

(52) U.S. Cl.
CPC ........... *G06N 10/00* (2019.01); *H03K 19/195* (2013.01)

(58) Field of Classification Search
CPC .............................. G06N 10/00; H03K 19/195
See application file for complete search history.

(56) References Cited

U.S. PATENT DOCUMENTS

| | | | |
|---|---|---|---|
| 11,244,240 B2 * | 2/2022 | Martinis | G06N 10/00 |
| 2014/0297247 A1 * | 10/2014 | Troyer | G06F 30/20 |
| | | | 703/21 |
| 2019/0164059 A1 * | 5/2019 | Denchev | G06N 3/126 |
| 2020/0057957 A1 * | 2/2020 | Johnson | G06N 10/40 |

(Continued)

FOREIGN PATENT DOCUMENTS

WO    2019/077240 A1    4/2019

OTHER PUBLICATIONS

European Search Report for corresponding European Application No. 20305707, dated Dec. 9, 2020.

(Continued)

*Primary Examiner* — Kurtis R Bahr
(74) *Attorney, Agent, or Firm* — Meagher Emanuel Laks Goldberg & Liao, LLP

(57) ABSTRACT

The present disclosure relates to a compiling method (50) for converting an input quantum circuit into an output quantum circuit compliant with predetermined constraints of a quantum computer, said input quantum circuit being composed of quantum gates to be applied to a set of qubits, said quantum gates arranged successively in an execution order, wherein said method comprises, for each quantum gate of the input quantum circuit processed according to the execution order:
if the processed quantum gate corresponds to an operator of a set of synthesizable operators: (S53) update the synthesizable accumulated operator to include the operator corresponding to the quantum gate,
otherwise: a) (S54) synthesize a partial quantum sub-circuit partially implementing the current synthesizable accumulated operator and modify accordingly the synthesizable accumulated operator, and b) (S55) append the partial quantum sub-circuit to the output quantum circuit.

15 Claims, 6 Drawing Sheets

(56) References Cited

U.S. PATENT DOCUMENTS

2020/0226197 A1* 7/2020 Woerner .............. G06N 10/00
2020/0257987 A1* 8/2020 McGeoch ............ G06N 5/003
2020/0327441 A1* 10/2020 Cao ..................... G06N 10/00

OTHER PUBLICATIONS

Nash et al., "Quantum circuit optimizations for NISQ architectures", arXiv:1904.01972v3, Apr. 24, 2020.
Meijer-Van De Griend et al., "Architecture-aware synthesis of phase polynomials for NISQ devices", arxiv.org. Cornell University Library, 201 Olin Library Cornell University Ithaca. NY, 14853, Apr. 13, 2020.
Kissinger et al., CNOT circuit extraction for topologically-constrained quantum memories, arXiv:1904.00633v2, May 29, 2019.
Aaronson et al., "Improved simulation of stabilizer circuits", Physical Review A, 70(5), Nov. 2004.

* cited by examiner a)

b)

COMPILING METHOD AND SYSTEM WITH PARTIAL SYNTHETIZATION OF QUANTUM COMPUTER COMPLIANT QUANTUM CIRCUITS

CROSS-REFERENCE TO RELATED APPLICATIONS

This application claims priority to European Application No. EP 20305707.0, filed Jun. 26, 2020, which is herein incorporated by reference in its entirety.

TECHNICAL FIELD

This disclosure relates to quantum computing compiling for converting an input quantum circuit into an output quantum circuit compliant with predetermined constraints of a quantum computer, particularly connectivity constraints between qubits of the quantum computer.

BACKGROUND

The promise of quantum computing relies on the ability to implement high-level quantum circuits, containing unitary quantum gates picked in some arbitrary universal set, into low-level quantum circuits, compliant with the quantum computer's constraints.

One particularly important constraint is the connectivity constraint. Indeed, in most technologies, qubits are placed in the quantum computer along some grid-like layout and can only interact according to this layout. Long range interactions, between qubits that are not directly connected in this layout, are not feasible and shall be implemented using a decomposition into close-range interactions between qubits. This is usually known as the qubit routing problem, since we need to route quantum information along the qubit layout.

In general, the high-level quantum circuit does not distinguish between physical qubits (the actual hardware qubits) and logical qubits (the values of the physical qubits) and said high-level quantum circuit describes the operations to be applied to the logical qubits without considering the connectivity constraints.

However, in a quantum computer, the mapping of the logical qubits onto the physical qubits can be modified. In other words, a logical qubit can pass from a physical qubit to another, and compiling aims e.g. at ensuring that the logical qubits that are to be processed by an entangling quantum gate in the high-level functional quantum circuit are mapped to physical qubits that are actually connected in the quantum computer.

For that purpose, most known methods rely on SWAP gates insertion to "route" the logical qubits across the layout of the quantum computer. An example of SWAP gates insertion method solving the qubit routing problem is given by e.g. the document WO 2019/077240 A1.

Another approach relies on quantum computer constraints aware synthesis of quantum circuits. In this approach, the quantum circuit is first described using a data structure that can be used to synthetize a quantum circuit while considering the quantum computer's constraints. This has recently been applied to the synthesis of subsets of operators such as linear Boolean operators (i.e. CNOT only quantum circuits) in [KvdG19], phase polynomials (CNOT+RZ quantum circuits) in [vdGD20]. These methods are usually limited to a subgroup of the unitary group and thus heavily relies on a preliminary decomposition of the input quantum circuit into a sequence of input quantum sub-circuits that can be described using the synthesizable data structure, and subsequently synthesized into output quantum sub-circuits that are quantum computer compliant. Additional quantum gates are then inserted between the synthesized output quantum sub-circuits in order to obtain the final output quantum circuit implementing the whole input quantum circuit.

Approaches relying on quantum computer compliant synthesis generally provide output quantum circuits that have fewer quantum gates than those obtained with SWAP gates insertion methods. However, quantum computer compliant synthesis requires performing a preliminary complex analysis of the input quantum circuit and requires synthesizing potentially large output quantum sub-circuits which might be computationally expensive.

BRIEF SUMMARY

The present disclosure aims at proposing a solution for converting an input quantum circuit into a quantum computer compliant output quantum circuit that reduces the need for synthesizing large output quantum circuits while limiting the final number of quantum gates of the output quantum circuit.

According to a first aspect, the present disclosure relates to a quantum computing compiling method for converting an input quantum circuit into an output quantum circuit compliant with predetermined constraints of a quantum computer, said input quantum circuit being composed of quantum gates to be applied to a set of qubits, said quantum gates arranged successively in an execution order, wherein said method comprises initializing a synthesizable accumulated operator and initializing the output quantum circuit, said method further comprising, for each quantum gate of the input quantum circuit processed according to the execution order:

responsive to the processed quantum gate corresponding to an operator of a set of synthesizable operators: update the synthesizable accumulated operator to include the operator corresponding to the quantum gate;

responsive to the processed quantum gate not corresponding to an operator of a set of synthesizable operators: a) synthesize a partial quantum sub-circuit partially implementing the current synthesizable accumulated operator such that applying the synthesizable accumulated operator followed by an operator corresponding to the processed quantum gate is equivalent to applying an operator corresponding to the partial quantum sub-circuit followed by a modified synthesizable accumulated operator, and b) append the partial quantum sub-circuit to the output quantum circuit.

Hence, the present disclosure relates to a quantum computing compiling method that processes iteratively an input quantum circuit, by processing successively the quantum gates composing said input quantum circuit, according to the execution order of said quantum gates.

For each processed quantum gate, the proposed method evaluates if the corresponding operator, applied by said processed quantum gate, belongs to a set of synthesizable operators.

In practice, the set of synthesizable operators is predetermined and corresponds to operators that can be described by a high level synthesizable description language, and that can be accumulated, i.e. combining two synthesizable operators yields a synthesizable operator. In other words, if the input quantum circuit comprises successive quantum gates which correspond to synthesizable operators of the set, then the combination of these quantum gates corresponds to a synthesizable operator of the set and is referred to as synthesizable accumulated operator.

Hence, if the processed quantum gate corresponds to an operator of the set of synthesizable operators, then it is possible to update the synthesizable accumulated operator by including the operator corresponding to the processed quantum gate. In other words, the synthesizable accumulated operator is iteratively augmented to include the operators of the successive processed quantum gates which correspond to synthesizable operators.

If the processed quantum gate does not correspond to an operator of the set of synthesizable operators, then its corresponding operator cannot be included in the synthesizable accumulated operator. In that case, the current synthesizable accumulated operator is used to synthesize a quantum computer compliant quantum sub-circuit.

However, in order to limit the synthetization complexity, the current synthesizable accumulated operator is only partially synthetized. A partial quantum sub-circuit that partially implements said current synthesizable accumulated operator is synthesized while considering the quantum computer's constraints. Basically, the partial quantum sub-circuit synthetized implements only the operations of the current synthesizable accumulated operator that, in the output quantum circuit, need to be implemented before the processed quantum gate and not after. The operations of the current synthesizable accumulated operator that can be implemented after the processed quantum gate are not synthesized and remain in the synthesizable accumulated operator which is modified to account for the fact it has been partially synthesized into the partial quantum sub-circuit.

In other words, the synthesizable accumulated operator is decomposed into two synthesizable operators:

a first synthesizable operator that is impacted by the processed quantum gate and needs to be synthesized and included in the output quantum circuit before adding the processed quantum gate in the output quantum circuit; and a second synthesizable operator (i.e. the modified synthesizable accumulated operator) that is not impacted by the processed quantum gate and needs not to be synthesized to be able to add the processed quantum gate into the output quantum circuit; hence the second synthesizable operator commutes with the operator corresponding to the processed quantum gate in the sense that the operator corresponding to the processed quantum gate can be indifferently applied before or after the second synthesizable operator.

The first synthesizable operator is synthesized by considering the quantum computer's constraints, thereby producing a quantum sub-circuit which, when combined with the processed quantum gate, corresponds to the partial quantum sub-circuit and is quantum computer compliant.

Due to the above mentioned commutativity between the second synthesizable operator (i.e. the modified synthesizable accumulated operator) and the operator corresponding to the processed quantum gate, applying the synthesizable accumulated operator followed by the operator corresponding to the processed quantum gate is equivalent to applying an operator corresponding to the partial quantum sub-circuit followed by the modified synthesizable accumulated operator.

Hence, the proposed quantum computing compiling method reduces the synthetization complexity by requiring only to partially synthetize the synthesizable accumulated operator. It is noted that, in some cases, it might be necessary to fully synthetize the synthesizable accumulated operator to be able to include the processed quantum gate in the output quantum circuit, in which case the modified synthesizable accumulated operator would correspond to the identity operator. However, the goal here is to partially synthetize when possible, such that the modified synthesizable accumulated operator will be different from the identity operator for all or at least part of the processed quantum gates of the input quantum circuit.

Since portions of the input quantum circuit are synthetized using synthetization algorithms which are aware of the quantum computer's constraints, such as those described in [KvdG19] or [vdGD20], the number of quantum gates composing the output quantum circuit will generally be lower than with SWAP gates insertion methods.

In specific embodiments, the compiling method can further comprise one or more of the following features, considered either alone or in any technically possible combination.

In specific embodiments, the compiling method comprises synthesizing a last quantum sub-circuit implementing a last synthesizable accumulated operator obtained after having processed the last quantum gate of the input quantum circuit according to the execution order and appending the last quantum sub-circuit to the output quantum circuit.

In specific embodiments, the compiling method comprises implementing by a non-quantum computer (i.e. a classical computer manipulating bits rather than qubits) at least a part of a last synthesizable accumulated operator obtained after having processed the last quantum gate of the input quantum circuit according to the execution order.

In specific embodiments, the quantum gates that correspond to synthesizable operators include Clifford gates.

In specific embodiments, the quantum gates that correspond to synthesizable operators consist in CNOT gates.

In specific embodiments, the compiling method comprises a preliminary step of decomposing each SWAP gate of the input quantum circuit into CNOT gates. More generally, it is possible to decompose any quantum gate into CNOT gate(s) and local rotations.

In specific embodiments, the input quantum circuit comprises only one-qubit quantum gates and two-qubits quantum gates, wherein each two-qubits quantum gate of the input quantum circuit can be decomposed into one or more CNOT gates.

In specific embodiments, the synthesizable operators correspond to reversible linear Boolean operators, described as $N_q \times N_q$ invertible Boolean matrices, wherein $N_q$ is the number of qubits of the input quantum circuit.

In specific embodiments, for a processed quantum gate of the input circuit that is a one-qubit quantum gate applied to the qubit of index q, and A being the operator corresponding to the current synthesizable accumulated operator, synthesizing the partial quantum sub-circuit comprises synthesizing a set of fan-in CNOT gates having as target qubit the qubit of index q', the set of fan-in CNOT gates corresponding to an operator which modifies $A^{-1}$ to produce an operator $B^{-1}$ having the row of index q' with a single non-null value at the column of index q, wherein B is the operator corresponding to the modified synthesizable accumulated operator and the partial quantum sub-circuit comprises the set of fan-in CNOT gates followed by the processed quantum gate applied to the qubit of index q'.

In specific embodiments, synthesizing the partial quantum sub-circuit further comprises synthesizing a set of fan-out CNOT gates having as source qubit the qubit of index q', the set of fan-out CNOT gates further causing the operator $B^{-1}$ to have the column of index q with a single non-null value, wherein the partial quantum sub-circuit comprises the set of fan-in CNOT gates followed by the set of fan-out CNOT gates followed by the processed quantum gate applied to the qubit of index q'.

In specific embodiments, synthesizing the partial quantum sub-circuit comprising synthesizing a set of fan-in CNOT gates, the compiling method comprises:

synthesizing a plurality of candidate partial quantum sub-circuits for one first processed quantum gate of the input quantum circuit, associated to respective candidate target qubits for a set of fan-in CNOT gates, synthesizing a plurality of candidate partial quantum sub-circuits for at least one second processed quantum gate of the input quantum circuit, associated to respective candidate target qubits for a set of fan-in CNOT gates and/or to respective candidate partial quantum sub-circuits of the first processed quantum gate, and selecting one candidate partial quantum sub-circuit for each processed quantum gate among the first processed quantum gate and each second processed quantum gate, the selected candidate partial quantum sub-circuits minimizing the number of CNOT gates over a predetermined number of successive processed quantum gates of the input quantum circuit.

In specific embodiments, for a processed quantum gate of the input circuit that is a one-qubit quantum gate applied to the qubit of index q, synthesizing the partial quantum sub-circuit comprises synthesizing a quantum sub-circuit c such that the corresponding operator c̃ satisfies the following expression: $B^{-1} = \tilde{c} \cdot A^{-1}$ wherein A is the operator corresponding to the current synthesizable accumulated operator; B is the operator corresponding to the modified synthesizable accumulated operator and $B^{-1}$ is composed of coefficients $b_{ij}$ such that, for some index q':

$$\begin{cases} b_{iq} = 0 \; \forall \, i \neq q' \\ b_{q'j} = 0 \; \forall \, j \neq q \\ b_{q'q} = 1 \end{cases}$$

and wherein the partial quantum sub-circuit corresponds to the quantum sub-circuit c followed by the processed quantum gate applied to the qubit of index q'.

In specific embodiments, the quantum gates that correspond to synthesizable operators include Clifford gates, and synthesizing the partial quantum sub-circuit for a non-Clifford Pauli rotation quantum gate comprises computing a Pauli operator P' for the non-Clifford Pauli rotation, performing a local basis change for each qubit in the support of P', preferably by changing the basis of each qubit in the support of P' to the axis Z, and synthesizing a set of fan-in CNOT gates having as target qubit a qubit in the support of P'.

In specific embodiments, synthesizing the partial quantum sub-circuit comprises computing a tree T, preferably a Steiner tree, including a predetermined set of qubits (also referred to as terminal nodes), based on a connectivity graph G representing the connectivity constraints of the quantum computer, and synthesizing a set of fan-in CNOT gates based on the computed tree T having as target qubit a qubit in the predetermined set of qubits.

According to a second aspect, the present disclosure relates to a computer program product comprising instructions which, when executed by at least one processor, configure said at least one processor to carry out a quantum computing compiling method according to any one of the embodiments of the present disclosure.

According to a third aspect, the present disclosure relates to a computer-readable storage medium comprising instructions which, when executed by at least one processor, configure said at least one processor to carry out a quantum computing compiling method according to any one of the embodiments of the present disclosure.

According to a fourth aspect, the present disclosure relates to a computer system comprising at least one processor configured to carry out a quantum computing compiling method according to any one of the embodiments of the present disclosure.

BRIEF DESCRIPTION OF DRAWINGS

The invention will be better understood upon reading the following description, given as an example that is in no way limiting, and made in reference to the figures which show.

In these figures, references identical from one figure to another designate identical or analogous elements. For reasons of clarity, the elements shown are not to scale, unless explicitly stated otherwise.

DETAILED DESCRIPTION

As discussed above, the present disclosure relates to a compiling method 50 and system in the context of quantum computing.

More specifically, the compiling method 50 aims at converting a high level input quantum circuit into a low level output quantum circuit that is compliant with predetermined constraints of a target quantum computer, such as connectivity constraints between qubits of the target quantum computer.

The input quantum circuit is composed of quantum gates to be applied to a set of qubits. The quantum gates appear in the input quantum circuit in an execution order, which corresponds to the order according which said quantum gates are successively applied to the set of qubits over time.

Figure 1:
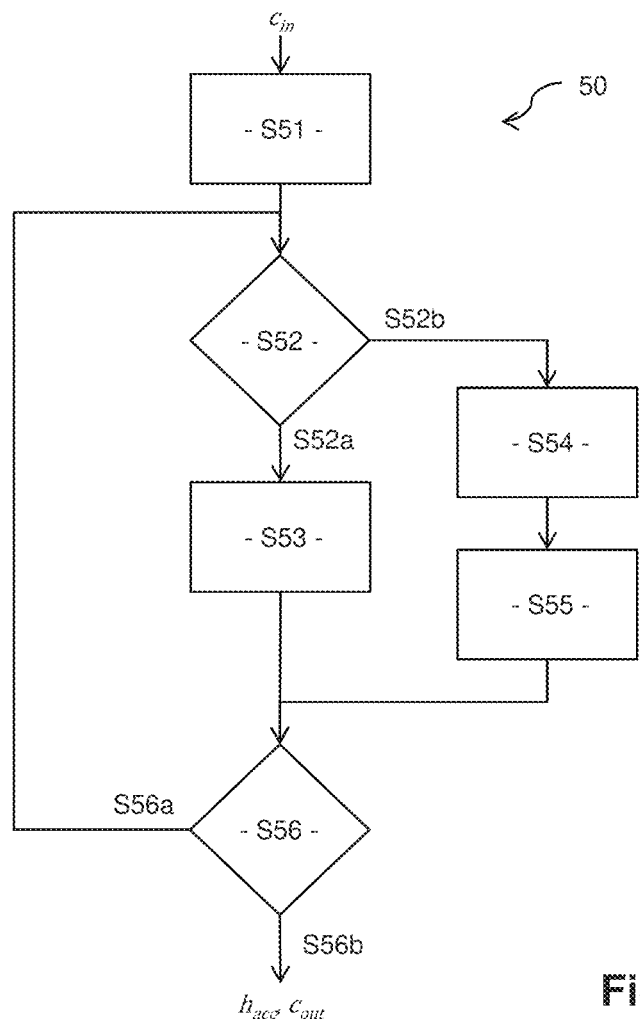
FIG. 1: a diagram representing the main steps of an exemplary embodiment of a quantum computing compiling method.

FIG. 1 represents the main steps of a compiling method 50 for converting the input quantum circuit into an output quantum circuit compliant with the constraints of the target quantum computer.

The compiling method 50 is carried out by a computer system (not represented in the figures). In preferred embodiments, the computer system comprises one or more processors (which may belong to a same computer or to different computers) and storage means (magnetic hard disk, optical disk, electronic memory, or any computer readable storage medium) in which a computer program product is stored, in the form of a set of program-code instructions to be executed in order to implement all or part of the steps of the compiling method 50. Alternatively, or in combination thereof, the computer system can comprise one or more programmable logic circuits (FPGA, PLD, etc.), and/or one or more specialized integrated circuits (ASIC), etc., adapted for implementing all or part of said steps of the compiling method 50. In other words, the computer system comprises a set of means configured by software (specific computer program product) and/or by hardware (processor, FPGA, PLD, ASIC, etc.) to implement the steps of the compiling method 50. It is emphasized that the compiling method is carried out by a classical (non-quantum) computer, it is the output quantum circuit that is then executed by a quantum computer.

For instance, we can assume that the input quantum circuit $c_{in}$ is composed of a set $\mathcal{G}_{in}$ of unitary quantum gates, and that the output quantum circuit $c_{out}$ has quantum gates in a quantum gate set $\mathcal{G}_{out}$. It should be noted that the set $\mathcal{G}_{out}$ may contain the exact same quantum gates as $\mathcal{G}_{in}$ but with additional constraints, such as connectivity constraints between the qubits of the target quantum computer.

We also define a subset $S \subseteq \mathcal{G}_{in}$ of quantum gates that correspond to synthesizable operators. As discussed above, the synthesizable operators correspond to operators that can be described by a high level synthesizable description language, and that can be accumulated, i.e. such that combining two synthesizable operators yields a synthesizable operator. Hence, the subset S corresponds to a predetermined set of synthesizable operators. We also define the subset $\bar{S} = \mathcal{G}_{in} \backslash S$ (i.e. the complement of S in $\mathcal{G}_{in}$), which includes the quantum gates that do not correspond to synthesizable operators.

Formally, we also define a set $\mathcal{H}$ of high-level synthesizable descriptions of synthesizable operators. Hence, any quantum gate in the subset S corresponds to a synthesizable operator that has a high-level synthesizable description in the set $\mathcal{H}$ and, for $h \in \mathcal{H}$, $[\![h]\!]$ corresponds to the synthesizable operator described by h. It should be noted that the distinction between high-level description of an operator and the operator itself is mainly formal and is not necessarily maintained throughout the present disclosure.

As can be seen in FIG. 1, the compiling method 50 comprises a step S51 of initializing both a synthesizable accumulated operator $[\![h_{acc}]\!]$ and the output quantum circuit $c_{out}$.

Preferably, the synthesizable accumulated operator $[\![h_{acc}]\!]$ is initialized to the identity operator Id, i.e. it does not modify the qubits. Also, the output quantum circuit $c_{out}$ is preferably initialized to an empty quantum circuit ε. In other embodiments, other initializations can be possible, for instance if the input quantum circuit $c_{in}$ corresponds to a portion of a larger quantum circuit, in which case the synthesizable accumulated operator $[\![h_{acc}]\!]$ and the output quantum circuit $c_{out}$ might be initialized to the synthesizable accumulated operator and to the output quantum circuit obtained for the previous portion of the larger quantum circuit.

In the following description, we assume in a non-limitative manner that the synthesizable accumulated operator $[\![h_{acc}]\!]$ is initialized to the identity operator Id and that the output quantum circuit $c_{out}$ is initialized to an empty quantum circuit ε.

As can be seen in FIG. 1, the compiling method 50 then iteratively processes the quantum gates of the input quantum circuit according to the execution order of these quantum gates. It should be noted that two parallel quantum gates of the input quantum circuit $c_{in}$, if any, are processed one after the other, the order of their processing being indifferent.

For a processed quantum gate g of the input quantum circuit, the compiling method 50 comprises a step S52 of evaluating whether the processed quantum gate g corresponds to a synthesizable operator, e.g. by evaluating whether the processed quantum gate g is in the subset S or in the subset $\bar{S}$.

If the processed quantum gate g is in the subset S ($g \in S$, reference S52a in FIG. 1), then the compiling method 50 comprises a step S53 of updating the synthesizable accumulated operator $[\![h_{acc}]\!]$ to include the operator $\tilde{g}$ corresponding to the processed quantum gate g. Formally, this can be described by an update function $u: \mathcal{H} \times S \to \mathcal{H}$ that verifies:

$$[\![u(h_{acc}, g)]\!] = \tilde{g} \cdot [\![h_{acc}]\!]$$

In the sequel, we denote by :: the concatenation of quantum circuits or gates, wherein $c = g_1 :: g_2$ corresponds to the quantum circuit c obtained by appending the quantum gate $g_2$ to the quantum gate $g_1$. The operator $\tilde{c}$ corresponding to the quantum circuit c is given by the following expression $\tilde{c} = \tilde{g}_2 \cdot \tilde{g}_1$, wherein $\tilde{g}_1$ and $\tilde{g}_2$ correspond to the operators associated to the quantum gates $g_1$ and $g_2$, respectively.

If the processed quantum gate g is not in the subset S ($g \in \bar{S}$, reference S52b in FIG. 1), then the compiling method 50 comprises a step S54 of synthesizing a partial quantum sub-circuit $c_p$ which partially implements the synthesizable accumulated operator $[\![h_{acc}]\!]$. The synthesizing step S54 uses a synthetization algorithm that is aware of the quantum computer's constraints, and the partial quantum sub-circuit $c_p$ is therefore quantum computer compliant. For instance, the synthetization algorithm used during the synthesizing step S54 may be one those described in [KvdG19] or [vdGD20]. Some detailed non-limitative examples are also provided hereinbelow.

Basically, the partial quantum sub-circuit $c_p$ implements only the operations of the current synthesizable accumulated operator $[\![h_{acc}]\!]$ that, in the output quantum circuit $c_{out}$, need to be implemented before the processed quantum gate g and not after. The operations of the current synthesizable accumulated operator $[\![h_{acc}]\!]$ that can be implemented after the processed quantum gate are preferably not synthesized and remain in a modified synthesizable accumulated operator $[\![h'_{acc}]\!]$. The modified synthesizable accumulated operator $[\![h'_{acc}]\!]$ becomes the current synthesizable accumulated operator $[\![h_{acc}]\!]$ for the subsequent processed quantum gate of the input quantum circuit $c_{in}$ ($h_{acc} \leftarrow h'_{acc}$).

The partial quantum sub-circuit $c_p$ is such that applying the synthesizable accumulated operator $[\![h_{acc}]\!]$ followed by the operator $\tilde{g}$ corresponding to the processed quantum gate g is equivalent to applying the operator $\tilde{c}_p$ corresponding to the partial quantum sub-circuit $c_p$ followed by the modified synthesizable accumulated operator $[\![h'_{acc}]\!]$. Formally, this can be described by an extraction function e: $\mathcal{H} \times \overline{S} \therefore \mathcal{H} \times \mathcal{G}*_{out}$, wherein * stands for Kleene's star, that verifies:

$$h'_{acc}, c_p = e(h_{acc}, g) \Rightarrow \tilde{g} \cdot [\![h'_{acc}]\!] \cdot \tilde{c}_p$$

In other words, the extraction function e tells how to commute the processed quantum gate g with the synthesizable accumulated operator $[\![h_{acc}]\!]$ as the cost of updating $[\![h_{acc}]\!]$ into $[\![h'_{acc}]\!]$ and turning the quantum gate g into a partial quantum sub-circuit $c_p$.

After the synthesizing step S54, the compiling method 50 comprises a step S55 of appending the partial quantum sub-circuit to the output quantum circuit $c_{out}$ ($c_{out} \leftarrow c_{out} :: c_p$).

After the updating step S53 or the appending step S55, the compiling method 50 comprises a step S56 of evaluating whether the last quantum gate of the input quantum circuit $c_{in}$ has been processed.

If the last quantum gate of the input quantum circuit $c_{in}$ has not been processed (reference S56a in FIG. 1), the compiling method 50 continues by processing the next quantum gate of the input quantum circuit $c_{in}$, according to the execution order of the quantum gates.

If the last quantum gate of the input quantum circuit $c_{in}$ has been processed (reference S56b in FIG. 1), then the result of the compiling method 50 corresponds to the output quantum circuit $c_{out}$ (which is compliant with the target quantum computer's constraints) and to the last synthesizable accumulated operator $[\![h_{acc}]\!]$, such that $\tilde{c}_{in} = [\![h_{acc}]\!] \cdot \tilde{c}_{out}$.

In most cases, the last synthesizable accumulated operator $[\![h_{acc}]\!]$ will be different from the identity operator. If the last synthesizable accumulated operator $[\![h_{acc}]\!]$ is indeed different from the identity operator, then it is possible, according to a first example, to synthesize a last quantum sub-circuit $c_l$ implementing the last synthesizable accumulated operator $[\![h_{acc}]\!]$ and to append the last quantum sub-circuit $c_l$ to the output quantum circuit $c_{out}$ ($c_{out} \leftarrow c_{out} :: c_l$). According to another example, all or part of the last synthesizable accumulated operator $[\![h_{acc}]\!]$ may be implemented by a non-quantum computer (i.e. a classical computer manipulating bits rather than qubits), if the corresponding operations can be efficiently applied by a non-quantum computer on the measured qubit values.

An exemplary pseudo-code implementation for the compiling method 50 depicted in FIG. 1 is given below.

```
h_acc ← Id
c_out ← ε
for g in c_in do // according to the execution order
    if g ∈ S then
        h_acc ← u(h_acc, g)
    else
        h'_acc, c_p ← e(h_acc, g)
        h_acc ← h'_acc
        c_out ← c_out :: c_p
    end if
end for
return h_acc, c_out
```

In practice, the set of synthesizable operators may vary, together with how the update function u and the extraction function e may be implemented. In the sequel, we provide examples for the case where the set of synthesizable operators corresponds the set of reversible linear Boolean operators, and for the case where the set of synthesizable operators corresponds to the Clifford operators (the set of reversible linear Boolean operators being actually a subset of the Clifford operators).

Example with Reversible Linear Boolean Operators

In this example, we consider in a non-limitative manner the set of reversible quantum circuits over $N_q$ qubits comprising only CNOT gates. This set generates the entire set of reversible linear Boolean operators over $N_q$ variables and contains the set of all $N_q$ elements permutations. Each synthesizable operator may be represented as a $N_q \times N_q$ invertible Boolean matrix, each row representing an output parity of the quantum circuit. It is also simple to update such an operator via some row (resp. column) operations to accommodate for left (resp. right) composition of the operator by a CNOT gate.

In this example, we assume in a non-limitative manner that:

$\mathcal{G}_{in}$ contains any one-qubit quantum gate and CNOT gates on arbitrary pairs of qubits; if necessary, it is possible to convert beforehand two-qubits quantum gates of the input quantum circuit $c_{in}$ into CNOT gates (for instance any SWAP gate can be converted into three CNOT gates, or any two-qubits quantum gate can be decomposed into CNOT gate(s) and local rotations);

$\mathcal{G}_{out}$ contains any one-qubit quantum gate and CNOT gates compliant with some connectivity graph G (representing the connectivity constraints of the target quantum computer);

$S = \{CNOT_{i,j} | i, j \in V(G)\}$ is the set of CNOT gates on arbitrary pairs of qubits (the qubits being the vertices $V(G)$ of the graph G);

$\overline{S}$ corresponds to the one-qubit quantum gates of the input quantum circuit $c_{in}$;

$\mathcal{H}$ is the set of invertible $N_q \times N_q$ Boolean matrices.

In this case, the update function u may be expressed as follows:

$$u(A, CNOT_{i,j}) = E_{i,j} \cdot A$$

expression in which:

A corresponds to the $N_q \times N_q$ Boolean matrix describing the synthesized accumulated operator;

$E_{i,j}$ corresponds to the $N_q \times N_q$ identity matrix with one additional 1 at row j column i.

Given some one-qubit quantum gate g acting on the qubit of index q and the $N_q \times N_q$ Boolean matrix A describing the synthesized accumulated operator, the extraction function e produces a G-compatible quantum sub-circuit c consisting in CNOT gates in the subset $\overline{S}$ such that $B^{-1} = \tilde{c} \cdot A^{-1}$, up to some row permutations, can be expressed as:

$$B^{-1} = \begin{pmatrix} 0 & \cdots & 0 & \overset{q}{1} & 0 & \cdots & 0 \\ & & & 0 & & & \\ & B' & & \vdots & & B'' & \\ & & & 0 & & & \end{pmatrix}$$

expression in which B' and B" are $(N_q-1) \times (N_q-1)$ Boolean matrices. In other words, $B^{-1}$ is composed of coefficients $b_{ii}$ such that, for some index q':

$$\begin{cases} b_{iq} = 0 \ \forall \ i \neq q' \\ b_{q'j} = 0 \ \forall \ j \neq q \\ b_{q'q} = 1 \end{cases}$$

In other words, the quantum sub-circuit c synthesizes a row and a column of A in order to make it act as the identity on the wanted qubit. Purely in terms of linear operator synthesis, it means that we synthesize the parity {q} on some qubit of index q' and remove the qubit of index q from any other parity carried by the other qubits. The extraction function e can be expressed as:

$$e(A,g) = (B, c :: g')$$

expression in which g' is the one-qubit quantum gate g applied to the qubit of index q' and B and c are defined as above. The partial quantum sub-circuit $c_p$ corresponds to $c_p = c :: g'$.

We now describe an exemplary implementation of the extraction function e. We denote by $e_q$ the parity row vector comprising a single 1 at the column of index q:

$$e_q = \begin{bmatrix} 0 \ ... \ 0 \ \overset{q}{1} \ 0 \ ... \ 0 \end{bmatrix}$$

Then, the extraction function e works in two stages:

computing the vector $y = e_q \cdot A$ produces a bit vector describing which wire of the quantum sub-circuit should be fold using a set of fan-in CNOT gates (i.e. CNOT gates that share the same target) onto one of them; this sets one line (of index q') of our linear operator to the singleton parity {q}; this is the line whose qubit will receive the processed one-qubit quantum gate g';

after updating $A^{-1}$ accordingly, the qth column of the operator may be synthesized by distributing the line chosen at the previous step onto every line containing a nonzero qth component; this can be achieved using a set of fan-out CNOT gates (i.e. CNOT gates sharing the same control).

It should be noted that, in some cases, it is not necessary to implement a set of fan-out CNOT gates. This will be the case if the processed quantum gate g is a phase gate (i.e. a diagonal operator). Indeed, for a phase gate, it is sufficient to produce an operator $B^{-1}$ having the parity {q}. Since the operator corresponding to a phase gate is diagonal, it will trivially commute, and it is not necessary to clean up the column of index q of $B^{-1}$, thus avoiding the need for a set of fan-out CNOT gates and saving up approximately half of the CNOT gates required to insert the processed quantum gate g into the output quantum circuit $c_{out}$. Hence, we simply need to be able to produce the implementation of a set of fan-in CNOT gates and, possibly, a set of fan-out CNOT gates that are compliant with the quantum computer's constraints.

To perform this synthesis of the quantum sub-circuit c such that $B^{-1} = \tilde{c} \cdot A^{-1}$, it is possible to:

compute the vector $y = e_q \cdot A$, and define $\{y_1, \ldots, y_k\}$ the set of indexes of the non-null values of the vector y;

compute a tree T (preferably a Steiner tree) comprising nodes, including terminal nodes which correspond to the qubits having their indexes in $\{y_1, \ldots, y_k\}$, using the connectivity graph G;

select a terminal node $y_l$ as the root (i.e. target of the set of fan-in CNOT gates).

Once the root is selected, the algorithm as described by the following pseudo-code implementation may be applied to compute the set of fan-in CNOT gates of the quantum sub-circuit c.

```
c ← ε
while |T| > 1 do
        v ← a leaf of T that is not the root
        u ← the only neighbor node of v in T
        if u ∉ {y_1, ..., y_k}
                    c ← c :: CNOT_{u,v}
        end if
        c ← c :: CNOT_{v,u}
        T.remove(v) // remove the node v from T
end while
return c
```

The quantum sub-circuit c produced corresponds to a set of fan-in CNOT gates with the input terminal nodes $\{y_1, \ldots, y_k\}$ as control except for the selected root which corresponds to the target. All CNOT gates used in the quantum sub-circuit c are compliant with the connectivity graph G, making the quantum sub-circuit c compliant with the qubits' connectivity. The resulting quantum sub-circuit c comprises (2(l−1)−k) CNOT gates where l=|T| is the size of the tree and k is the number of terminal vertices (i.e. the Hamming weight of y), including the selected root.

When necessary, the set of fan-out CNOT gates may be synthesized in a similar way, except that the terminal nodes $\{y'_1, \ldots, y'_k\}$ used to compute a tree T', are found by looking at lines of the intermediate operator obtained after having obtained the parity {q} at the row which corresponds to the selected root (i.e. target of the set of fan-in CNOT gates), that have a non-zero qth component.

The algorithm as described by the following pseudo-code implementation may be applied to compute the set of fan-out CNOT gates of the quantum sub-circuit c.

```
ones ← {y'_1, ..., y'_k}
Tmp ← T' // copy of T'
while |Tmp| > 1 do // setting all the vertices of Tmp (T') to one
        v ← a leaf of Tmp
        u ← the only neighbor node of v in Tmp
        if u ∉ ones
                    c ← c :: CNOT_{v,u}
                    ones.insert(u) // add a one at index u
        end if
        Tmp.remove(v) // remove the node v from Tmp
end while
while |T'| > 1 do // getting rid of all ones (except for root)
        v ← a leaf of T' that is not the root
        u ← the only neighbor node of v in T'
        c ← c :: CNOT_{u,v}
        T'.remove(v) // remove the node v from T'
end while
return c
```

The quantum sub-circuit c obtained comprises both a set of fan-in CNOT gates and a set of fan-out CNOT gates.

We now provide a practical example in order to illustrate the conversion of an input quantum circuit $c_{in}$ into a quantum computer compliant output quantum circuit $c_{out}$, in the case where the quantum gates which correspond to synthesizable operators consist in CNOT gates on arbitrary pairs of qubits. The one-qubit quantum gates do not correspond to synthesizable operators and belong to the subset $\overline{S}$.

Figure 2:
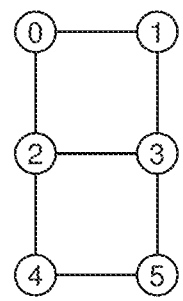
FIG. 2: a schematic representation of a graph representing the connectivity constraints of a target quantum computer.

FIG. 2 represents schematically a connectivity graph G representing the connectivity constraints of a target computer comprising $N_q = 6$ qubits $q_0$ to $q_5$. Qubits that can interact directly are connected by a single line. For instance, while a CNOT gate $CNOT_{0,1}$ is compatible with the connectivity constraints of the target quantum computer, the CNOT gates $CNOT_{0,3}$ and $CNOT_{3,4}$ are not compatible with said connectivity constraints.

Figure 3:
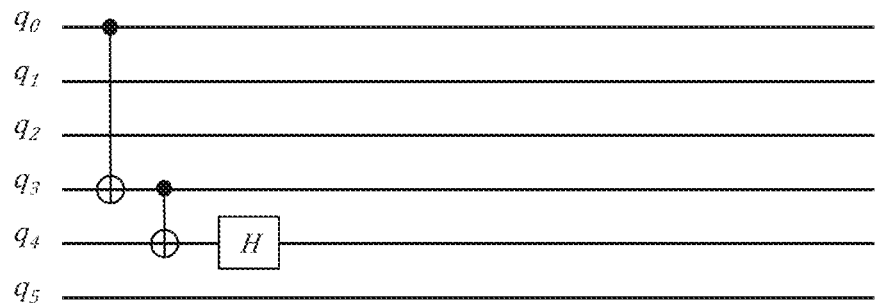
FIG. 3: a schematic representation of an example of input quantum circuit.

FIG. 3 represents schematically an example of input quantum circuit $c_{in}$. This input quantum circuit $c_{in}$ comprises, in the execution order:
first a CNOT gate $CNOT_{0,3}$;
then a CNOT gate $CNOT_{3,4}$; and
finally, a Hadamard gate H.

For instance, the output quantum circuit $c_{in}$ is initialized to an empty quantum circuit and the synthesizable accumulated operator, represented by a $N_q \times N_q$ matrix A is initialized to the identity operator:

$$A = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{pmatrix}$$

The CNOT gate $CNOT_{0,3}$ is processed first and corresponds to a synthesizable operator. The update function u multiplies the matrix $E_{0,3}$ by the matrix A and updates the matrix A (representing the synthesizable accumulated operator) by adding its row of index 0 into its row of index 3. After the update, the matrix A is as follows:

$$A = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 1 & 0 & 0 & 1 & 0 & 0 \\ 0 & 0 & 0 & 0 & 1 & 0 \\ 0 & 0 & 0 & 0 & 0 & 1 \end{pmatrix}$$

Then, the CNOT gate $CNOT_{3,4}$ is processed and corresponds to a synthesizable operator. The update function u multiplies the matrix $E_{3,4}$ by the matrix A and updates the matrix A (representing the synthesizable accumulated operator) by adding its row of index 3 into its row of index 4. After the update, the matrix A is as follows:

$$A = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 1 & 0 & 0 & 1 & 0 & 0 \\ 1 & 0 & 0 & 1 & 1 & 0 \\ 0 & 0 & 0 & 0 & 0 & 1 \end{pmatrix}$$

Then, the Hadamard gate H is processed and does not correspond to a synthesizable operator. For this Hadamard gate H, the extraction function e will produce a set of fan-in CNOT gates and a set of fan-out CNOT gates.

The Hadamard gate H is to be applied on the qubit $q_4$ (i.e. q=4) such that the goal is to produce a matrix $N_q \times N_q$ matrix $B^{-1}$ having a row having a single non-null value at the column of index q=4, and having a single non-null value in the column of index q=4.

Then the compiling method 50 computes the vector y by multiplying the vector $e_4=(0\ 0\ 0\ 0\ 1\ 0)$ by the matrix A (representing the synthesizable accumulated operator), which gives:

y=(1 0 0 1 1 0)

Based on the vector y, the possible choices for the index q' (i.e. for the root/row of the matrix $B^{-1}$ that will be made identical to $e_4$) are 0, 3 or 4. (i.e. $\{y_1, \ldots, y_k\}=\{0,3,4\}$) We assume that we select the index q'=3. It should be noted that the selected index q' might impact the number of CNOT gates that will be inserted, such that it might be beneficial to try different values for the index q' in order to minimize the number of CNOT gates inserted.

As discussed above, the matrix $B^{-1}$ is given by $B^{-1}=\tilde{c}\cdot A^{-1}$, such that it is possible to determine $B^{-1}$ by making operations on the rows of the matrix $A^{-1}$, which operations will correspond to CNOT gates in the quantum sub-circuit c corresponding to the operator $\tilde{c}$. The matrix $A^{-1}$ is the following:

$$A^{-1} = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 1 & 0 & 0 & 1 & 0 & 0 \\ 0 & 0 & 0 & 1 & 1 & 0 \\ 0 & 0 & 0 & 0 & 0 & 1 \end{pmatrix}$$

Figure 4:
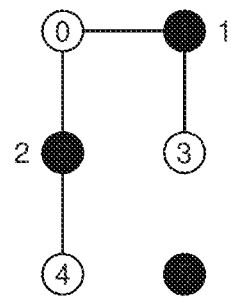
FIG. 4: a schematic representation of a tree computed for the synthesis of a set of fan-in CNOT gates, for the input quantum circuit of FIG. 3.

FIG. 4 represents schematically a tree which comprises the terminal nodes $\{0, 3, 4\}$, i.e. qubits $q_0$, $q_3$ and $q_4$. In FIG. 4, the nodes (qubits) which are not terminal nodes are represented by dark dots.

The target (root) for the set of fan-in CNOT gates corresponds to the qubit of index q'=3, i.e. $q_3$, and the rows of indexes 0 and 4 are going to be added to the row of index 4 (target/root) according to the tree.

Figure 5:
FIG. 5: a schematic representation of the synthesis of a set of fan-in CNOT gates, for the input quantum circuit of FIG. 3.
Figure 5:
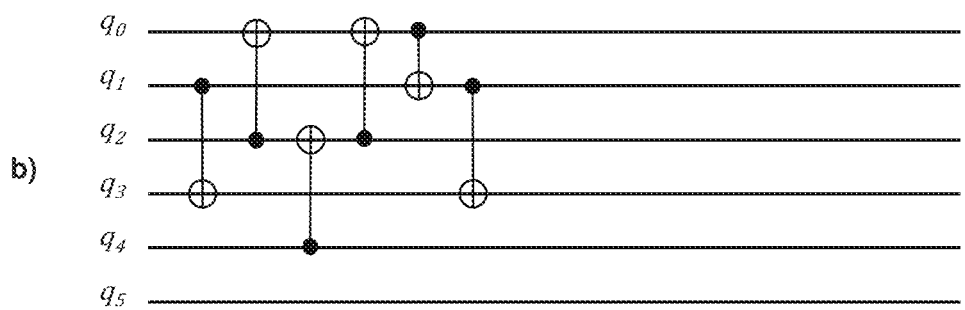

When applying the algorithm described above for the synthetization of the set of fan-in CNOT gates, we can see that, when considering the root $q_3$, there is a single leaf $q_4$. The algorithm will follow the path from the root $q_3$ to the leaf $q_4$. Along this path, the algorithm will add CNOT gates between a node and its parent node if this node is not a terminal node. In the considered example, the algorithm inserts the CNOT gates $CNOT_{1,3}$ and $CNOT_{2,0}$ in the synthesized quantum sub-circuit c. Part a) of FIG. 5 represents schematically the corresponding quantum sub-circuit c at this stage.

By adding the corresponding rows of the matrix $A^{-1}$ (adding the row of index 1 into the row of index 3, and then adding the row of index 2 into the row of index 0), we get the following matrix:

$$\begin{pmatrix} 1 & 0 & 1 & 0 & 0 & 0 \\ 0 & 1 & 0 & 0 & 0 & 0 \\ 0 & 0 & 1 & 0 & 0 & 0 \\ 1 & 1 & 0 & 1 & 0 & 0 \\ 0 & 0 & 0 & 1 & 1 & 0 \\ 0 & 0 & 0 & 0 & 0 & 1 \end{pmatrix}$$

Then the algorithm will follow the reverse path in T and add a CNOT gate between each node and its parent node along the reverse path. In the considered example, the algorithm inserts the CNOT gates $CNOT_{4,2}$, $CNOT_{2,0}$, $CNOT_{0,1}$ and $CNOT_{1,3}$ in the quantum sub-circuit c. Part b) of FIG. 5 represents schematically the corresponding quantum sub-circuit c at this stage.

By adding the corresponding rows of the previous matrix (adding the row of index 4 into the row of index 2, then adding the row of index 2 into the row of index 0, then adding the row of index 0 into the row of index 1, and then adding the row of index 1 into the row of index 3), we get the following matrix, which comprises the parity $e_4$ at the row of index q'=3:

$$\begin{pmatrix} 1 & 0 & 0 & 1 & 1 & 0 \\ 1 & 1 & 0 & 1 & 1 & 0 \\ 0 & 0 & 1 & 1 & 1 & 0 \\ 0 & 0 & 0 & 0 & 1 & 0 \\ 0 & 0 & 0 & 1 & 1 & 0 \\ 0 & 0 & 0 & 0 & 0 & 1 \end{pmatrix}$$

Figure 6:
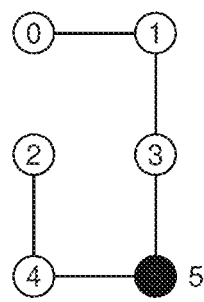
FIG. 6: a schematic representation of a tree computed for the synthesis of a set of fan-out CNOT gates, for the input quantum circuit of FIG. 3.

The compiling method 50 proceeds with the algorithm for synthesizing the set of fan-out gates, aiming at cancelling the non-zero values of the column of index q=4, except the non-zero value at the row of index q'=3. The non-zero values are located at the rows of indexes 0, 1, 2, 3 and 4, such that $\{y'_1, \ldots, y'_k\} = \{0,1,2,3,4\}$. FIG. 6 represents schematically a tree which comprises the terminal nodes $\{0, 1,2, 3,4\}$, i.e. qubits $q_0$, $q_1$, $q_2$, $q_3$ and $q_4$.

Figure 7:
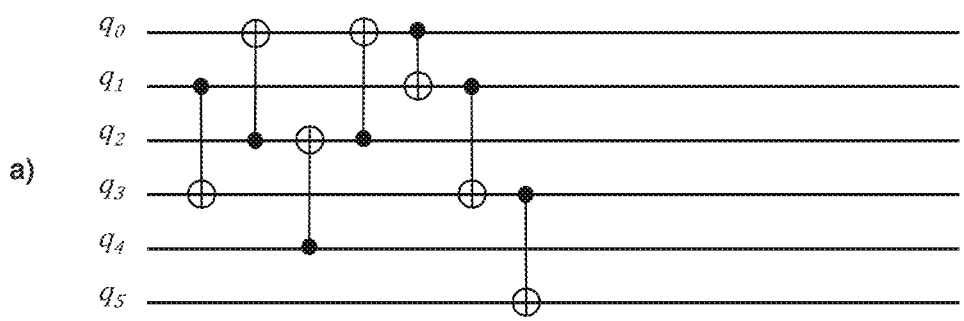
FIG. 7: a schematic representation of the synthesis of a set of fan-out CNOT gates, after having synthesized a set of fan-in CNOT gates, for the input quantum circuit of FIG. 3.

When applying the algorithm described above for the synthetization of the set of fan-out CNOT gates, the algorithm will follow the path from the root (control) $q_3$ to any leaf. Along this path, the algorithm will add CNOT gates between the root $q_3$ and any node for which the row in the previous matrix has a zero value at the column of index q=4. In the previous matrix, the row of index 5 is the only one having a zero value at the column of index 4. Hence, the algorithm inserts the CNOT gate $CNOT_{3,5}$ to the quantum sub-circuit c in part b) of FIG. 5. Part a) of FIG. 7 represents schematically the corresponding quantum sub-circuit c at this stage.

By adding the corresponding rows of the previous matrix (adding the row of index 3 into the row of index 5), we get the following matrix:

$$\begin{pmatrix} 1 & 0 & 1 & 0 & 0 & 0 \\ 0 & 1 & 0 & 0 & 0 & 0 \\ 0 & 0 & 1 & 0 & 0 & 0 \\ 1 & 1 & 0 & 1 & 0 & 0 \\ 0 & 0 & 0 & 1 & 1 & 0 \\ 0 & 0 & 0 & 0 & 1 & 1 \end{pmatrix}$$

Then the algorithm will follow the reverse path in T' and cancel the non-zero values, until the root $q_3$ is reached, by adding a CNOT gate between each node and its parent node along the reverse path. In the considered example, the algorithm inserts the CNOT gates $CNOT_{1,0}$, $CNOT_{4,2}$, $CNOT_{3,1}$, $CNOT_{5,4}$ and $CNOT_{3,5}$ in the quantum sub-circuit c. Part b) of FIG. 7 represents schematically the corresponding quantum sub-circuit c at this stage.

By adding the corresponding rows of the previous matrix (adding the row of index 1 into the row of index 0, then adding the row of index 4 into the row of index 2, then adding the row of index 3 into the row of index 1, then adding the row of index 5 into the row of index 4 and then adding the row of index 3 into the row of index 5), we get the matrix $B^{-1}$, which comprises the parity $e_4$ at the row of index q'=3, and a single non-zero value in the column of index q=4:

$$B^{-1} = \begin{pmatrix} 0 & 1 & 0 & 0 & 0 & 0 \\ 1 & 1 & 0 & 1 & 0 & 0 \\ 0 & 0 & 1 & 0 & 0 & 0 \\ 0 & 0 & 0 & 0 & 1 & 0 \\ 0 & 0 & 0 & 1 & 0 & 1 \\ 0 & 0 & 0 & 0 & 0 & 1 \end{pmatrix}$$

Figure 8:
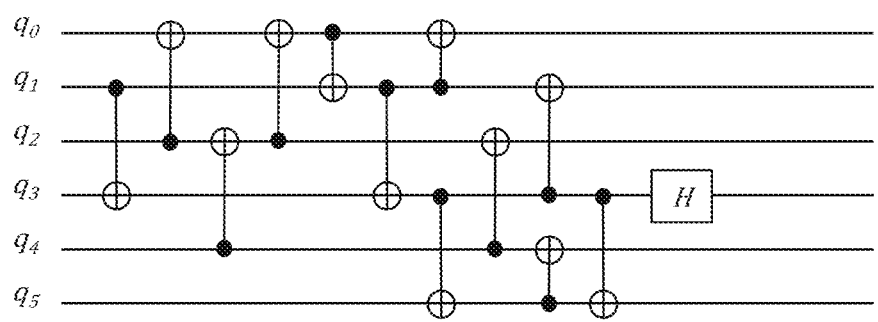
FIG. 8: a schematic representation of an example of output quantum circuit obtained for the input quantum circuit of FIG. 3.

The description of the modified synthesized accumulated operator is given by the matrix B. FIG. 8 represents the partial quantum sub-circuit $c_p$ which corresponds to the quantum sub-circuit c represented in part b) of FIG. 7 followed by the Hadamard gate H applied on the qubit of index q'=3, i.e. on qubit $q_3$. In this example, the Hadamard gate H is the last quantum gate of the input quantum circuit $c_{in}$, such that the output quantum circuit $c_{out}$ corresponds to the partial quantum sub-circuit $c_p$ represented in FIG. 8.

As discussed above, the last synthesized accumulated operator, which corresponds in the present example to the matrix B, may then be fully synthesized and the last synthesized quantum sub-circuit may be appended to the output quantum circuit $c_{out}$. Alternatively, it is possible to implement all or part of the operations of the matrix B by a non-quantum computer.

Figure 9:
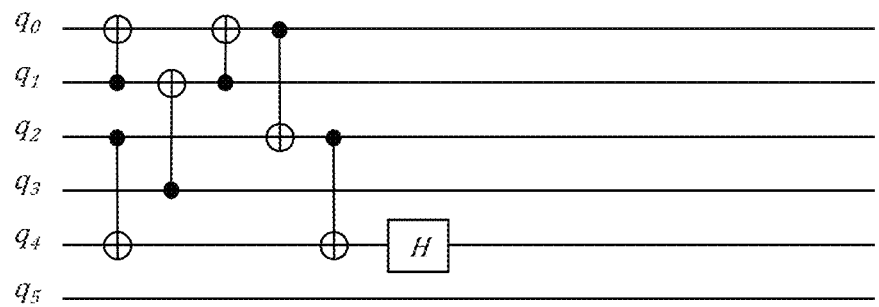
FIG. 9: a schematic representation of an example of optimized output quantum circuit obtained for the input quantum circuit of FIG. 3.

FIG. 9 represents schematically the output quantum circuit $c_{out}$ obtained from the input quantum circuit $c_{in}$ of FIG. 3, and by selecting q'=4 (instead of q'=3) together with more optimal trees. Compared to the output quantum circuit $c_{out}$ represented in FIG. 8, it can be seen that the number of CNOT gates has been drastically reduced. Hence, it is possible to optimize the partial quantum sub-circuit $c_p$ (and, in fine, the output quantum circuit $c_{out}$) by e.g. accurately selecting the root, i.e. the index q'.

Such an optimization may be performed for a single partial quantum sub-circuit $c_p$ or, preferably, by considering recursively a plurality of successive partial quantum sub-circuits $c_p$ computed for successive quantum gates which belong to the subset $\overline{S}$. Hence, in preferred embodiments, the compiling method 50 may comprise synthesizing a plurality of candidate partial quantum sub-circuits $c_{1,p}$ for one first processed quantum gate of the input quantum circuit $c_{in}$, associated to respective candidate target qubits (i.e. terminal nodes) for a set of fan-in CNOT gates, synthesizing a plurality of candidate partial quantum sub-circuits $C_{2,p}$ for at least one second processed quantum gate of the input quantum circuit $c_{in}$, associated to respective candidate target qubits (i.e. terminal nodes) for a set of fan-in CNOT gates and/or to respective candidate partial quantum sub-circuits $c_{1,p}$ of the first processed quantum gate, selecting one candidate partial quantum sub-circuit $c_{1,p}$, $c_{2,p}$ for each processed quantum gate among the first processed quantum gate and each second processed quantum gate, the selected candidate partial quantum sub-circuits $c_{1,p}$, $c_{2,p}$ minimizing the number of CNOT gates over a predetermined number of successive processed quantum gates of the input quantum circuit $c_{in}$ which belong to the subset $\overline{S}$.

Figure 10:
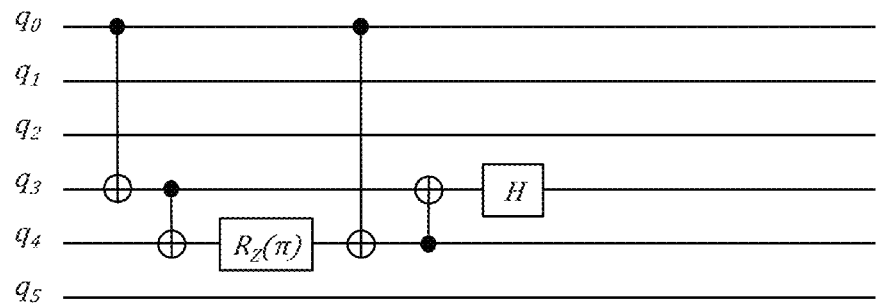
FIG. 10: a schematic representation of another example of input quantum circuit.

FIG. 10 represents schematically another example of input quantum circuit $c_{in}$ which comprises two quantum gates which belong to the subset $\overline{S}$, a phase quantum gate $R_z(\pi)$ applied on the qubit $q_4$ and an Hadamard gate H applied on the qubit $q_3$. When applying the algorithm for synthesizing the set of fan-in CNOT gates for the phase quantum gate $R_S(\pi)$, there will be three different terminal nodes for selecting the root (index q'): $\{y_1, \ldots, y_k\} = \{0, 3, 4\}$. As discussed above, the choice of the root may impact the number of CNOT gates of the partial quantum sub-circuit $c_{1,p}$. It may also impact the number of CNOT gates of the partial quantum sub-circuit $c_{2,p}$ synthesized to insert the Hadamard gate H.

Figure 11:
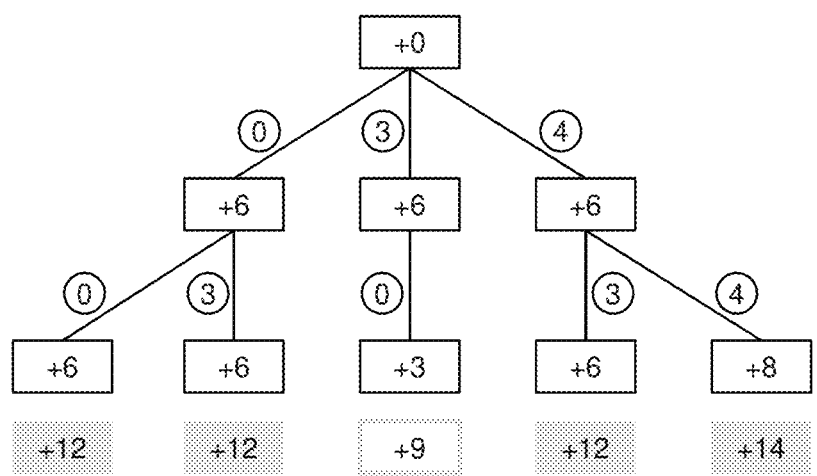
FIG. 11: a schematic representation of a tree illustrating the benefits of a recursive optimization scheme.

FIG. 11 represents a tree illustrating how the choice of specific roots might impact the total number of CNOT gates of the output quantum circuit $c_{out}$, in the case of the input quantum circuit $c_{in}$ of FIG. 10.

The top of the tree in FIG. 11 represents the situation right before computing the partial quantum sub-circuit $c_{1,p}$. For computing the partial quantum sub-circuit $c_{1,p}$, three different terminal nodes (i.e. candidate target qubits) are possible for selecting the root ($\{y_1, \ldots, y_k\}=\{0, 3, 4\}$), yielding three different candidate partial quantum sub-circuits $c_{1,p}$. The following nodes of the tree in FIG. 11 provide the costs in terms of CNOT gates of each of the candidate partial quantum sub-circuits $c_{1,p}$:

the first candidate partial quantum sub-circuit $c_{1,p}$ (for q'=0) comprises six CNOT gates;

the second candidate partial quantum sub-circuit $c_{1,p}$ (for q'=3) comprises six CNOT gates; and the third candidate partial quantum sub-circuit $c_{1,p}$ (for q'=4) comprises six CNOT gates.

At this stage, all three different terminal nodes (i.e. candidate target qubits) are equivalent in terms of CNOT gates required.

When applying the algorithm for synthesizing the set of fan-in CNOT gates for the Hadamard gate H, there will be also, in general, different terminal nodes (candidate target qubits) for selecting the root (index q'). The candidate target qubits are not necessarily the same after each candidate partial quantum sub-circuit $c_{1,p}$:

after the first candidate partial quantum sub-circuit $c_{1,p}$, the candidate target qubits for the root node are $\{0, 3\}$;

after the second candidate partial quantum sub-circuit $c_{1,p}$, the only candidate target qubit for the root node is $\{0\}$; and after the third candidate partial quantum sub-circuit $c_{1,p}$, the candidate target qubits for the root node are $\{3, 4\}$.

For each of these candidate target qubits of each candidate partial quantum sub-circuit $c_{1,p}$, a candidate partial quantum sub-circuit $c_{2,p}$ is computed. This yields five different candidate partial quantum sub-circuits $c_{2,p}$ comprising respectively six, six, three, six and eight CNOT gates. This yields also five different candidate output quantum circuits $c_{out}$ comprising respectively twelve, twelve, nine, twelve and fourteen CNOT gates. Hence, the best choice corresponds to the output quantum circuit $c_{out}$ obtained by selecting q'=3 for the partial quantum sub-circuit $c_{1,p}$ and q'=0 for the partial quantum sub-circuit $c_{2,p}$, which comprises nine CNOT gates.

It should be noted that such a recursive optimization may be performed other all or part of the quantum gates of the input quantum circuit $c_{in}$ which belong to the subset $\overline{S}$, or over a predetermined number $N_g$ of these quantum gates (in which case ($N_g-1$) is referred to as the depth of the recursive optimization).

Figure 12:
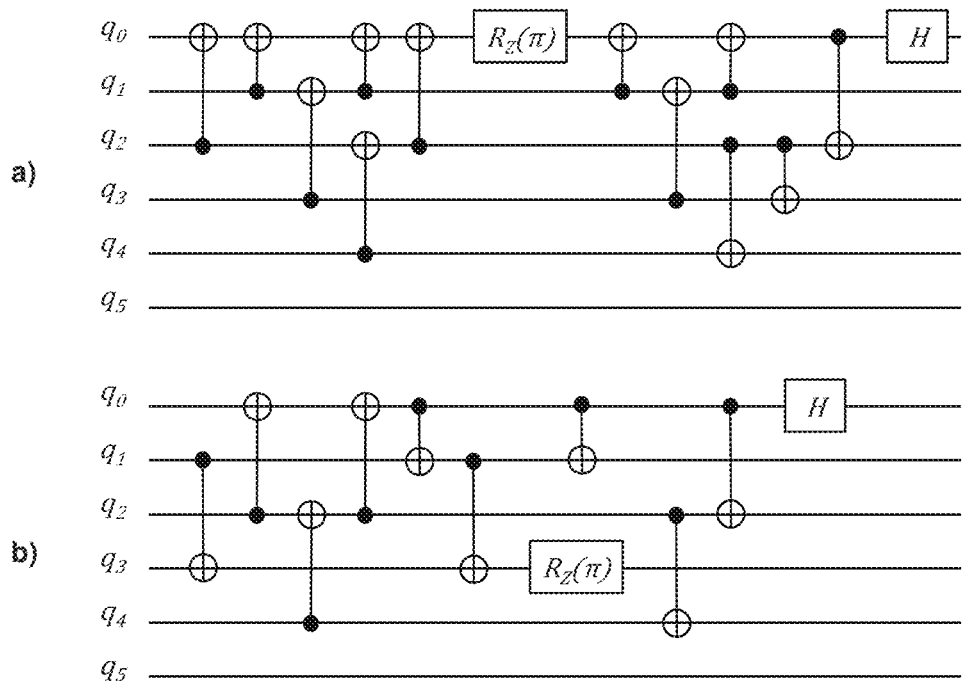
FIG. 12: schematic representations of output quantum circuits obtained for the input quantum circuit of FIG. 10, with and without the recursive optimization scheme.

FIG. 12 represents schematically the output quantum circuits $c_{out}$ obtained for different depths for the input quantum circuit $c_{in}$ of FIG. 10. More specifically, part a) of FIG. 12 represents the output quantum circuit $c_{out}$ obtained for a depth of zero (i.e. no recursive optimization), while selecting successively q'=0 for the partial quantum sub-circuit $c_{1,p}$ and q'=0 for the partial quantum sub-circuit $c_{2,p}$. Part b) of FIG. 12 represents the output quantum circuit $c_{out}$ obtained for a depth of one (i.e. recursive optimization over two successive quantum gates which belong to $\overline{S}$), while selecting successively q'=3 for the partial quantum sub-circuit $c_{1,p}$ and q'=0 for the partial quantum sub-circuit $C_{2,p}$.

Example with Clifford Operators

The natural extension of the class of reversible linear Boolean operators is the Clifford group $\mathcal{C}$. Clifford operators are operators that stabilize the Pauli group P. They can be represented efficiently using data structures called "Tableau" that specify how they act by conjugation over generators of the Pauli group $\mathcal{P}$ [AG04]. In practice, this means that we can implement a data structure $T_a$ (a Tableau), representing a Clifford operator in $\mathcal{C}$ that:

can be easily updated: $T_a \leftarrow \tilde{g} \cdot T_a$ or $T_a \leftarrow T_a \cdot \tilde{g}$ for some Clifford gate g;

can be used to efficiently compute the conjugate of some n-qubits Pauli operator P with respect to a Clifford operator $T_a$, by computing $T_a P T_a^\otimes$, yielding another Pauli operator (and potentially a phase s).

In the sequel, we define the support of a Pauli operator P as the set of qubits such that P acts non-trivially on them. For instance, if P=[I⊗Z⊗X⊗I], then the support of P is the set of indexes $\{1, 2\}$ since P acts as the identity operator on the qubits of indexes 0 and 3. For ease of notations, we drop the operators ⊗ in the sequel.

In the present example, we consider that $\mathcal{G}_{in}$ contains only Clifford gates and arbitrary Pauli rotations, $R_p$ for P∈ $\mathcal{P}$. We assume in a non-limitative manner that $\mathcal{G}_{out}$ contains the quantum gates CNOT, H, $R_X(\pi/2)$, $R_X(-\pi/2)$ and arbitrary $R_Z(\theta)$ rotations, the CNOT gates being restricted to some connectivity graph G.

Formally, we assume in the sequel that the set $\mathcal{H}$ of high-level synthesizable descriptions of synthesizable operators corresponds to the set $\mathcal{T}$ of Tableaus representing Clifford operators. $[\![ . ]\!]$ is the standard Tableau interpretation but reversed for ease of notation: $[\![ t_a ]\!] = U(T_a)^\dagger$ where U: $T_a \rightarrow U(T_a)$ associates to each Tableau $T_a$ its Clifford operator. In other words, $[\![ t_a ]\!]$ is the inverse of the Clifford operator described by $T_a$.

The subset S corresponds to the set of Clifford gates. Accordingly, the subset $\overline{S}$ includes the arbitrary Pauli rotations (i.e. the Pauli rotations with an angle $\theta \neq k \cdot \pi/2$ with k being an integer).

The update function u is the update of a stabilizer Tableau using a Clifford gate by right composition with the inverse:

$u(T_a, g) = T_a \cdot \tilde{g}^\dagger$

Upon encountering a non-Clifford Pauli rotation $R_p(\theta)$, and assuming the synthesizable accumulated operator is described by a Tableau $T_a$, the extraction function e performs as follows:

i) compute a Pauli operator P' and a phase s=±1 such that:

$s \cdot P' = T_a P T_a^\dagger$ ii) for each qubit i in the support of P', perform a local basis change using either a quantum gate H or $R_S(\pi/2)$ in order to change its basis to the axis Z (the choice of the axis Z is arbitrary and is the reason why we assume in the present example that the arbitrary Pauli rotations are $R_Z(\theta)$ rotations in $\mathcal{G}_{out}$; however, another axis may be chosen in other examples), i.e. if P'[i]=Y then apply a quantum gate $R_X(\pi/2)$ on the qubit of index i, and if P'[i]=X then apply a quantum gate H on the qubit of index i; for instance, if P'=[I X Y Z I], then we produce a Clifford quantum sub-circuit $c=H_1::R_{X,2}(\pi/2)$ (i.e. H on the qubit of index 1 and $R_X(\pi/2)$ on the qubit of index 2);

iii) select a target qubit of index q' in the support of P' and perform the algorithm for synthesizing a set of fan-in CNOT gates presented above, in order to generate a set of fan-in CNOT gates from all qubits in support of P' to the qubit of index q' (which index q' might be optimized according to the recursive optimization scheme described above), thus updating the Clifford quantum sub-circuit c by appending to it the set of fan-in CNOT gates;

iv) compute the modified synthesizable accumulated operator, described by a Tableau $T'_a$, by left composition with c:

$$T'_a \leftarrow \tilde{c} \cdot T_a$$

v) return the Tableau $T'_a$ as the description of the modified synthesizable accumulated operator and the partial quantum sub-circuit $c_p = c :: R_{Z,q'}(s \cdot \theta)$, with the phase quantum gate $R_Z(s \cdot \theta)$ applied on the selected qubit of index q' (root).

It is easy to verify that:

$$[\![ u(T_a, g) ]\!] = [\![ T_a \cdot g^\dagger ]\!] = U(g) \cdot U(T_a)^\dagger = \tilde{g} \cdot [\![ T_a ]\!]$$

Moreover, the following proposition about the extraction function e holds. Let $T_a$ be a Tableau and $R_p(\theta)$ be an arbitrary Pauli rotation. If $(T'_a, c_p) = e(T_a, R_p(\theta))$ then $R_p(\theta) \cdot [\![ t_a ]\!] = [\![ T'_a ]\!] \cdot \tilde{c}_p$.

Indeed, by construction we have:

$$c_p = c :: R_{Z,q'}(s \cdot \theta)$$

expression in which c and q' are such that:

$$c :: R_{Z,q'}(s \cdot \theta) :: c^\dagger = R_{P'}(s.\theta)$$

where $s \cdot P' = T_a P T_a^\dagger$ and c is a Clifford quantum sub-circuit. This implies that $\tilde{c}_p = \tilde{c} \cdot R_{P'}(s \cdot \theta)$. More specifically, c holds the local basis changes and the set of fan-in CNOT gates necessary to the implementation of $R_{P'}(s \cdot \theta)$.

Hence, we have:

$$R_P(\theta) \cdot [\![ T_a ]\!] = [\![ T_a ]\!] \cdot [\![ T_a ]\!]^\dagger \cdot R_P(\theta) \cdot [\![ T_a ]\!] \cdot [\![ T_a ]\!]^\dagger \cdot [\![ T_a ]\!]$$

$$= [\![ T_a ]\!] \cdot U(T_a) \cdot R_P(\theta) \cdot U(T_a)^\dagger$$

$$= [\![ T_a ]\!] \cdot R_{T_a P T_a^\dagger}(s \cdot \theta)$$

$$= [\![ T_a ]\!] \cdot R_{P'}(s \cdot \theta)$$

$$= [\![ T_a ]\!] \cdot \tilde{c}^\dagger \cdot \tilde{c} \cdot R_{P'}(s \cdot \theta)$$

$$= [\![ \tilde{c} \cdot T_a ]\!] \cdot \tilde{c}_p$$

$$= [\![ T'_a ]\!] \cdot \tilde{c}_p$$

Figure 13:
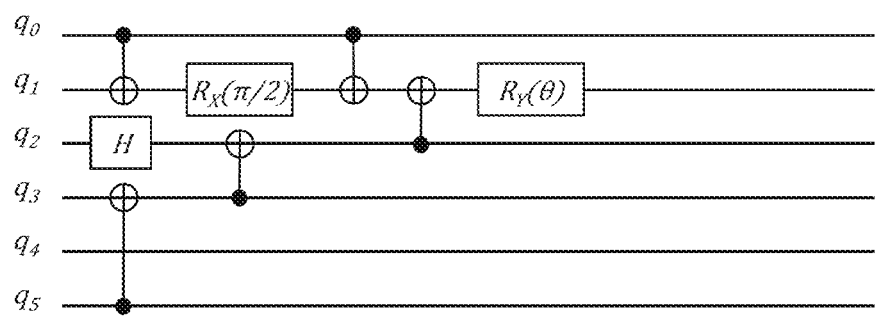
FIG. 13: a schematic representation of another example of input quantum circuit.

FIG. 13 represents schematically an example of input quantum circuits $c_{in}$ which comprises a single non-Clifford Pauli rotation (the last quantum gate $R_Y(\theta)$). The target quantum computer is assumed to have the connectivity graph G represented in FIG. 2.

The compiling method 50 aggregates a synthesizable accumulated operator represented by a Tableau $T_a$ corresponding to all the quantum gates except the last one, using right composition with the inverse of the quantum gates (update function u).

Upon reaching the last quantum gate $R_Y(\theta)$, the compiling method 50 constructs the rotation axis of the quantum gate, yielding the Pauli operator P corresponding to [I Y I I I]. Once conjugated with respect to the current Tableau $T_a$, this gives the Pauli operator P' which corresponds to [I Z X Z I Z] and an additional phase s=+1. Hence, the qubits in support of P' are {1, 2, 3, 5}, and we need to synthetize a rotation of support {1, 2, 3, 5}. For that purpose, we insert a Hadamard quantum gate H in order to change the basis of the qubit of index 2 into the Z axis.

Figure 14:
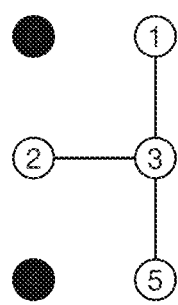
FIG. 14: a schematic representation of a tree computed for the synthesis of a set of fan-in CNOT gates, for the input quantum circuit of FIG. 13.

Then we compute a tree T (preferably a Steiner tree) containing all the support of the rotation, i.e. having the terminal nodes {1, 2, 3, 5}. FIG. 14 represents the computed tree T. Then the algorithm for synthetizing the set of fan-in CNOT gates, presented above, is applied. The selected root corresponds for instance to the qubit of index q'=1.

Figure 15:
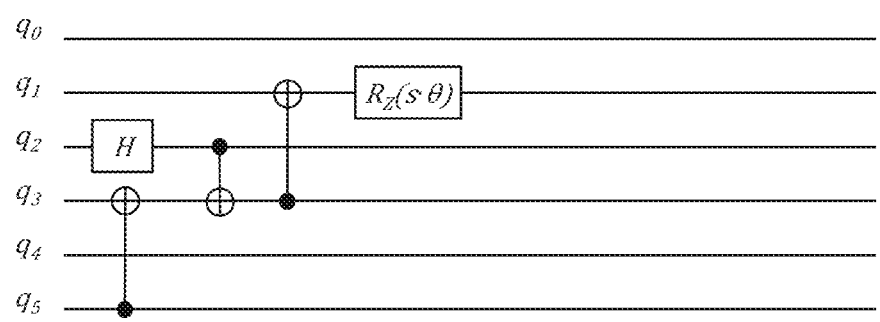
FIG. 15: a schematic representation of an output quantum circuit obtained for the input quantum circuit of FIG. 13.

FIG. 15 represents schematically the output quantum circuit $c_{out}$ obtained for the input quantum circuits $c_{in}$ represented in FIG. 13. As can be seen in FIG. 15; the output quantum circuit $c_{out}$ comprises first the Hadamard quantum gate H applied to the qubit of index 2 (local basis change), and the set of fan-in CNOT gates which comprise CNOT gates $CNOT_{5,3}$, $CNOT_{2,3}$ and $CNOT_{3,1}$. Finally, the output quantum circuit $c_{out}$ comprises the phase quantum gate $R_Z(s \cdot \theta)$ (with s=+1) applied on the selected qubit (root), i.e. applied on the qubit of index q'=1. The modified synthesizable accumulated operator $T'_a$ is obtained by left composition of the of the current synthesizable accumulated operator $T_a$ with the operator e corresponding to the quantum sub-circuit c.

As discussed above, the last synthesizable accumulated operator, represented by a Tableau $T_a$, can be either completely synthesized, or processed in all or part by a non-quantum computer.

It is emphasized that the present invention is not limited to the above exemplary embodiments. Variants of the above exemplary embodiments are also within the scope of the present invention.

The above description clearly illustrates that by its various features and their respective advantages, the present disclosure reaches the goals set for it. In particular, by accumulating in the synthesizable accumulated operator the operators of a set of synthesizable operators, the need for synthetization is reduced together with the associated computational complexity. Also, when encountering an operator that does not belong to the set of synthesizable operators, the synthesizable accumulated operator may be only partially synthesized, thereby reducing also the need for synthetization.

REFERENCES

[AG04] Scott Aaronson and Daniel Gottesman: "*Improved simulation of stabilizer circuits*", Physical Review A, 70(5), November 2004, arxiv.org/pdf/quant-ph/0406196.pdf.

[KvdG19] Aleks Kissinger and Arianne Meijer van de Griend: "*CNOT circuit extraction for topologically-constrained quantum memories*", 2019, arxiv.org/pdf/1904.00633.pdf.

[vdGD20] Arianne Meijer van de Griend and Ross Duncan: "*Architecture-aware synthesis of phase polynomials for NISQ devices*", 2020, arxiv.org/pdf/2004.06052.pdf.

What is claimed is:

1. A compiling method for converting an input quantum circuit into an output quantum circuit compliant with predetermined constraints of a quantum computer, said input quantum circuit being composed of quantum gates to be applied to a set of qubits, said quantum gates arranged successively in an execution order, wherein a predetermined set of synthesizable operators is defined, wherein said compiling method comprises:

initializing a synthesizable accumulated operator and the output quantum circuit; and processing the quantum gates of the input quantum circuit according to the execution order, and for each processed quantum gate:

responsive to the processed quantum gate corresponding to an operator of the predetermined set of synthesizable operators, updating the synthesizable accumulated operator to include the operator corresponding to the processed quantum gate; and responsive to the processed quantum gate not corresponding to an operator of the predetermined set of synthesizable operators:

decomposing the synthesizable accumulated operator into a first synthesizable operator and a second synthesizable operator, said second synthesizable operator referred to as modified synthesizable accumulated operator, wherein said modified synthesizable accumulated operator is not impacted by the processed quantum gate in that it commutes with the operator corresponding to the processed quantum gate;

synthesizing a partial quantum sub-circuit by synthesizing the first synthesizable operator to produce a quantum sub-circuit and by appending the processed quantum gate to the quantum sub-circuit, wherein the modified synthesizable accumulated operator becomes the synthesizable accumulated operator for a subsequent processed quantum gate; and appending the partial quantum sub-circuit to the output quantum circuit.

2. The compiling method according to claim 1, comprising synthesizing a last quantum sub-circuit implementing a last synthesizable accumulated operator obtained after having processed a last quantum gate of the input quantum circuit according to the execution order, and appending the last quantum sub-circuit to the output quantum circuit.

3. The compiling method according to claim 1, comprising implementing by a non-quantum computer a last synthesizable accumulated operator obtained after having processed a last quantum gate of the input quantum circuit according to the execution order.

4. The compiling method according to claim 1, wherein the quantum gates that correspond to synthesizable operators include Clifford gates.

5. The compiling method according to claim 4, wherein the quantum gates that correspond to synthesizable operators consist of CNOT gates.

6. The compiling method according to claim 5, wherein, if the input quantum circuit comprises SWAP gates, the compiling method further comprises a preliminary step of decomposing each SWAP gate of the input quantum circuit into CNOT gates.

7. The compiling method according to claim 4, wherein the input quantum circuit consists of one-qubit quantum gates and two-qubits quantum gates, wherein each two-qubits quantum gate of the input quantum circuit can be decomposed into one or more CNOT gates.

8. The compiling method according to claim 1, wherein the predetermined set of synthesizable operators correspond to reversible linear Boolean operators, described as $N_q \times N_q$ invertible Boolean matrices, wherein $N_q$ is the number of qubits of the input quantum circuit.

9. The compiling method according to claim 8, wherein, if the processed quantum gate of the input quantum circuit is a one-qubit quantum gate applied to the qubit of index q, the step of synthesizing the partial quantum sub-circuit comprises synthesizing a quantum sub-circuit c such that the corresponding operator $\tilde{c}$ satisfies the following expression:

$$B^{-1} = \tilde{c} \cdot A^{-1}$$

wherein:

A is the current synthesizable accumulated operator; and

B is the modified synthesizable accumulated operator and $B^{-1}$ is composed of coefficients $b_{ij}$ such that, for some index q':

$$\begin{cases} b_{iq} = 0 \ \forall \ i \neq q' \\ b_{q'j} = 0 \ \forall \ j \neq q \\ b_{q'q} = 1 \end{cases}$$

wherein the partial quantum sub-circuit corresponds to the quantum sub-circuit c followed by the processed quantum gate applied to the qubit of index q'.

10. The compiling method according to claim 1, wherein, if the processed quantum gate of the input circuit is a one-qubit quantum gate applied to the qubit of index q, and A being the operator corresponding to a current synthesizable accumulated operator, the step of synthesizing the partial quantum sub-circuit comprises synthesizing a set of fan-in CNOT gates having a qubit of index q' as a target qubit, the set of fan-in CNOT gates corresponding to an operator which modifies $A^{-1}$ to produce an operator $B^{-1}$ having a row of index q' with a single non-null value at a column of index q, wherein B is the modified synthesizable accumulated operator and the partial quantum sub-circuit comprises the set of fan-in CNOT gates followed by the processed quantum gate applied to the qubit of index q'.

11. The compiling method according to claim 10, wherein the step of synthesizing the partial quantum sub-circuit further comprises synthesizing a set of fan-out CNOT gates having the qubit of index q' as a source qubit, the set of fan-out CNOT gates further causing the operator $B^{-1}$ to have the column of index q with a single non-null value, wherein the partial quantum sub-circuit comprises the set of fan-in CNOT gates followed by the set of fan-out CNOT gates followed by the processed quantum gate applied to the qubit of index q'.

12. The compiling method according to claim 11, wherein the step of synthesizing the partial quantum sub-circuit comprising synthesizing a set of fan-in CNOT gates comprises:

synthesizing a plurality of candidate partial quantum sub-circuits for one first processed quantum gate of the input quantum circuit, associated to respective candidate target qubits for a set of fan-in CNOT gates, a set of fan-in CNOT gates corresponding to a set of CNOT gates having a same target qubit;

synthesizing a plurality of candidate partial quantum sub-circuits for at least one second processed quantum gate of the input quantum circuit, associated to respective candidate target qubits for a set of fan-in CNOT gates and/or to respective candidate partial quantum sub-circuits of the first processed quantum gate; and selecting one candidate partial quantum sub-circuit for each of said one first processed quantum gate and said at least one second processed quantum gate, the selected candidate partial quantum sub-circuits minimizing a number of CNOT gates over a predetermined number of successive processed quantum gates of the input quantum circuit.

13. A computer program product comprising instructions which, when executed by at least one non-quantum processor, configure said at least one non-quantum processor to carry out a compiling method according to claim 1.

14. A computer-readable storage medium comprising instructions which, when executed by at least one non-quantum processor, configure said at least one non-quantum processor to carry out a compiling method according to claim 1.

15. A computer system comprising at least one non-quantum processor configured to carry out a compiling method according to claim 1.

* * * * *